United States Patent
Cases et al.

(10) Patent No.: US 8,269,505 B2
(45) Date of Patent: Sep. 18, 2012

(54) LOCATING SHORT CIRCUITS IN PRINTED CIRCUIT BOARDS

(75) Inventors: Moises Cases, Austin, TX (US); Bhyrav M. Mutnury, Austin, TX (US); Terence Rodrigues, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 457 days.

(21) Appl. No.: 12/638,044

(22) Filed: Dec. 15, 2009

(65) Prior Publication Data

US 2011/0140709 A1   Jun. 16, 2011

(51) Int. Cl.
*G01R 31/28* (2006.01)

(52) U.S. Cl. ........ 324/528; 324/527; 324/532; 324/533; 324/534; 324/535; 324/754.01; 324/763.01; 324/763.02

(58) Field of Classification Search .................. 324/528, 324/527, 532, 533, 534, 535, 754.01, 763.01, 324/763.02
See application file for complete search history.

(56) References Cited

U.S. PATENT DOCUMENTS

| | | | |
|---|---|---|---|
| 4,255,792 A * | 3/1981 | Das | 702/117 |
| 4,565,966 A * | 1/1986 | Burr et al. | 324/519 |
| 4,833,402 A * | 5/1989 | Boegh-Petersen | 324/755.08 |
| 5,006,788 A * | 4/1991 | Goulette et al. | 324/95 |
| 5,268,645 A * | 12/1993 | Prokoff et al. | 324/537 |
| 5,352,984 A * | 10/1994 | Piesinger | 324/532 |
| 5,442,299 A * | 8/1995 | Caggiano | 324/750.18 |
| 5,631,856 A * | 5/1997 | Keller et al. | 324/750.22 |
| 5,812,563 A | 9/1998 | Hedlund et al. | |
| 5,821,759 A | 10/1998 | Scaman et al. | |
| 5,838,060 A * | 11/1998 | Comer | 257/685 |
| 6,043,669 A * | 3/2000 | Carroll | 324/750.26 |
| 6,047,469 A * | 4/2000 | Luna | 29/830 |
| 6,141,093 A | 10/2000 | Argyle et al. | |
| 6,144,210 A * | 11/2000 | Brooks | 324/519 |
| 6,194,906 B1 * | 2/2001 | Yagii et al. | 324/750.16 |
| 6,218,851 B1 * | 4/2001 | Vodopivec et al. | 324/754.17 |
| 6,242,923 B1 | 6/2001 | Scaman et al. | |
| 6,291,978 B1 * | 9/2001 | Chandler et al. | 324/73.1 |
| 6,292,004 B1 * | 9/2001 | Kocher | 324/754.11 |
| 6,340,893 B1 * | 1/2002 | Prokopp | 324/754.03 |
| 6,400,128 B2 * | 6/2002 | Guidotti et al. | 324/73.1 |
| 6,452,410 B1 * | 9/2002 | Parker | 324/750.22 |
| 6,462,556 B2 * | 10/2002 | Yamashita et al. | 324/537 |
| 6,525,526 B1 * | 2/2003 | De Gruyter et al. | 324/763.01 |
| 6,734,681 B2 * | 5/2004 | Sabey | 324/528 |
| 6,798,212 B2 * | 9/2004 | Stierman et al. | 324/534 |
| 6,806,718 B2 * | 10/2004 | Berkely | 324/500 |
| 6,842,026 B2 * | 1/2005 | Yamaoka et al. | 324/756.07 |
| 6,861,863 B2 * | 3/2005 | Ishioka et al. | 324/756.01 |
| 6,867,597 B2 * | 3/2005 | Hauptner et al. | 324/533 |
| 7,053,637 B2 * | 5/2006 | Whitten et al. | 324/754.1 |

(Continued)

*Primary Examiner* — Patrick Assouad
*Assistant Examiner* — Lamarr Brown
(74) *Attorney, Agent, or Firm* — Thomas Tyson; Jeffrey L. Streets

(57) ABSTRACT

One embodiment provides a method of locating a short circuit in a printed circuit board. Test signals may be injected at different test points on the circuit board. The distance between each test point and the short circuit may be determined according to how long it takes for a signal reflection at the short circuit to propagate back to each test point. The distances between the various test points and the short circuit can be used to narrow the possible locations of the short circuit or even to pinpoint the location of the short circuit.

16 Claims, 3 Drawing Sheets

U.S. PATENT DOCUMENTS

| | | | |
|---|---|---|---|
| 7,081,908 B2 * | 7/2006 | Murakawa et al. | 324/527 |
| 7,173,445 B2 * | 2/2007 | Fujii et al. | 324/754.28 |
| 7,188,037 B2 | 3/2007 | Hidehira | |
| 7,282,922 B2 * | 10/2007 | Lo et al. | 324/534 |
| 7,902,831 B2 * | 3/2011 | Top et al. | 324/456 |
| 8,067,951 B2 * | 11/2011 | Miller | 324/755.01 |
| 2003/0090273 A1 * | 5/2003 | Hauptner et al. | 324/533 |
| 2003/0146763 A1 * | 8/2003 | Sunter | 324/527 |
| 2004/0232919 A1 * | 11/2004 | Lacey | 324/533 |
| 2006/0012376 A1 * | 1/2006 | Furse et al. | 324/534 |
| 2006/0182269 A1 * | 8/2006 | Lo et al. | 379/406.08 |
| 2008/0024161 A1 | 1/2008 | Coombs | |

* cited by examiner

LOCATING SHORT CIRCUITS IN PRINTED CIRCUIT BOARDS

BACKGROUND

1. Field of the Invention

The present invention relates to printed circuit boards, and more particularly to locating a short circuit in a multi-layered circuit board.

2. Background of the Related Art

Modern electronic packages are complex and contain multiple conductive layers, including power and ground layers, where each layer is formed in a different plane between nonconductive layers. Even a minuscule short circuit between two different conductive layers is sufficient to cause a package to fail. The short circuit may occur, for example, because a damaged component like a capacitor has been used during the assembly process. Alternatively, the short circuit may occur where a rework operation resulted in a minute solder splash bridging two voltage traces. A technique such as In-Circuit Test (ICT) can detect the existence of the short circuit, but not its location. A conventional approach for locating the short circuit is to physically depopulate each component between the power and ground planes, one at a time, until the short circuit disappears. However, this can be a very invasive, laborious, and time-consuming process.

BRIEF SUMMARY

One embodiment of the present invention provides a method of locating a short circuit between two layers of a printed circuit board. The method includes selecting first, second, and third non-collinear test points in one of the two layers. A test signal is injected at each of the three test points, resulting in signal reflections at the short-circuit. The distance between each test point and the short circuit is determined from the time required for each signal reflection to reach the respective test point. The location of the short circuit is then uniquely determined from its distance from of each of the three test points.

DETAILED DESCRIPTION

Embodiments of the present invention include methods of locating a short circuit between two layers of a multi-layered printed circuit board (PCB). Typically, the short circuit to be detected will electrically bridge a power layer and a ground layer. A technique such as In-Circuit Test (ICT) can be used to detect the existence of the short circuit in the printed circuit board during manufacturing, although ICT does not generally indicate the location of the short circuit. Furthermore, ICT is not able to indicate the location of a short circuit after the boards are loaded with components and when the short circuit occurs when mounting passive and active devices to the board. As an alternative to ICT, the existence of the short circuit may be inferred from an observed malfunction of the PCB.

The location of the short circuit can then be determined according to an embodiment of the invention by injecting test signals at different test points within the PCB. Each test signal will be partially reflected at the short circuit and propagate back to the test point from which the test signal originated. The signal reflection may be detected according to its effect on the voltage value of the test signal. For example, the signal reflection may cause a steep drop in voltage at the instant the signal reflection reaches the test point from which the test signal originated. The time required for the signal reflection to reach the point of origin of the test signal may be used to determine the distance between the test point and the short circuit. Generally, the distance between each of three, non-collinear test points and the short circuit can be used to pinpoint the location of the short circuit. In some cases, the use of as few as two test points is sufficient to locate the short circuit.

Figure 1:
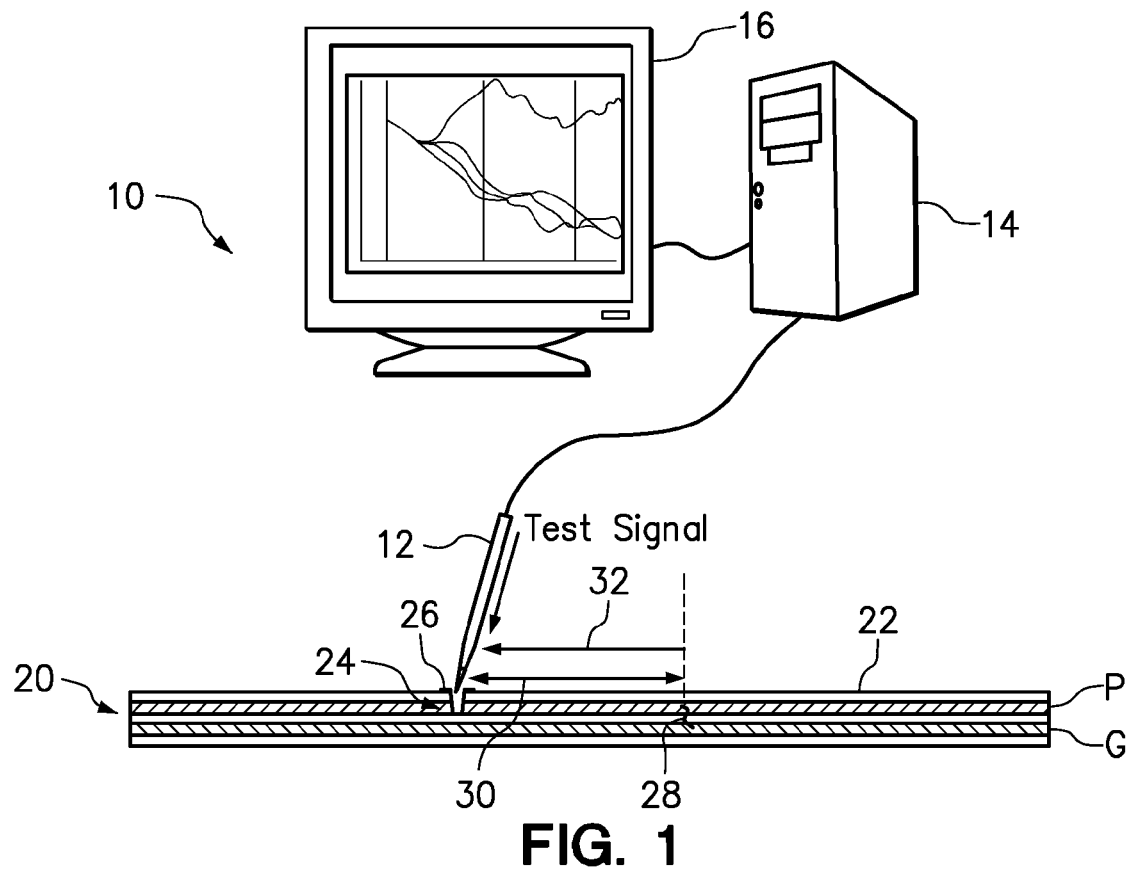
FIG. 1 is a schematic diagram of a circuit board testing system that may be used to identify the location of a short circuit in a printed circuit board.

FIG. 1 is a schematic diagram of a circuit board testing system 10 that may be used to identify the location of a short circuit 28 in a printed circuit board (PCB) 20 according to an embodiment of the invention. The testing system 10 includes a computer 14 having a display 16 and a test probe 12 connected to the computer 14. The computer 14 may be a specialized computer system, a general purpose computer such as a PC, or a combination thereof. For example, the computer 14 may include a personal computer (PC) in communication with an oscilloscope, or having software for emulating signal-analysis features of an oscilloscope. The test probe 12 may be, for example, a co-axial test probe known in the art apart from its application to the present invention. The computer system 14 may include testing software or firmware, including one or more drivers for controlling the test probe 12 to generate test signals and one or more analysis modules for analyzing the time-dependent behavior of the test signals to locate the short circuit 28.

The PCB 20 under test is a multilayered circuit board, such as a motherboard, an application card, or an interposer of a chip package. The PCB 20 is not drawn to scale, and has certain features enlarged for clarity. The PCB 20 will typically have many layers, such as signal layers, dielectric layers, resistive layers, one or more ground layers, and one or more power layers. To simplify illustration of the PCB 20, only selected layers are shown, including a power layer ("P") and a ground layer ("G"). A large number of vias are typically provided throughout the PCB 20, although only one via 24 is shown for simplicity of illustration. A via, generally, is a plated through hole extending through one or more layers of a PCB, providing electrical pathways between layers. For example, a via may connect a signal trace in one layer with a signal trace in another layer. A via may also provide a signal path for connecting a microcircuit (e.g. transistor) in one layer to a ground layer or power layer. The via 24 in this example extends from a surface 22 of the PCB 20 to the power layer P. An exposed contact pad 26 is provided on the surface 22 of the PCB 20. The contact pad 26 is a metal plated feature that is electrically connected with the power via 24. The contact pad 26 and power via 24 may be integrally formed, such as by electroplating the contact pad 26 and power via 24 in an electroplating step.

The short circuit 28 in the PCB 20 is a defect in, or damaged area of, the PCB 20 that electrically bridges the power layer P with the ground layer G. The short circuit 28 typically will not be apparent to the naked eye. The existence of the short circuit 28 may be determined using ICT, for example. Alternatively, the existence of the short circuit 28 may be detectable indirectly, such as due to an electrical malfunction in the PCB 20. Due to the complexity of the PCB 20, however, manually locating the short circuit 28 could be very time consuming. The testing system 10 can be used to locate the short circuit 28 without visually observing the short circuit. Specifically, according to an embodiment of the invention, the test probe 12 may be used to inject a test signal at each of multiple test points throughout the PCB 20. Each test signal may be analyzed using the computer 14 to determine the distance from each test point to the short circuit 28. The location of the short circuit 28 may then be determined according to the distance between each of the test points and the short circuit 28.

A test signal having a desired waveform is generated by the computer 14 and "injected" at a selected test point within a selected layer of the PCB 20 using the test probe 12. The test signal is preferably a step signal, such as a zero to 1 volt transition that remains at 1 volt. Generally, the test signal may be injected at the selected test point within the selected layer by introducing the test signal into a via connected to the selected layer at the selected test point. The via then carries the signal into the PCB 20 to the selected layer. The large number of vias usually present within the PCB 20 for electronic contact with surface mounted components gives rise to a large number of test points from which to select. Here, by way of example, a test signal 30 is injected into the power layer P at the location of the power via 24 by contacting the probe 12 with the contact pad 26 that is concentric with the via 24, and generating the test signal 30. The test signal 30 travels through the via 24 to the power layer P, where the test signal 30 then propagates radially outwardly within the power layer P from the location where the via 24 intersect with the power layer P. When the propagated test signal reaches the short circuit 28, the test signal is partially reflected. The resulting signal reflection 32 propagates back through the via 24 to the contact pad 26. Where the test signal is a step signal, the response is a step response, such as a standing step response that is not periodic.

The test probe may be a co-axial probe having two electrical leads, including one lead for transmitting the test signal and the other lead for grounding. The test signal may be an electrical signal having a voltage that remains constant throughout the test. The test signal 30 is optionally plotted on the display 16, such as by plotting the voltage of the test signal as a function of time. The display 16 may be an oscilloscope display, which may show a graphical representation of the test signal over time. The signal reflection 32 has an observable influence on the voltage being monitored by the computer 14, such as causing a steep voltage drop at the time the signal reflection 32 reaches the via 24, which is the point of origin of the test signal 30 in this example. As further explained below, the effect of the reflection 32 on each test signal may be analyzed by the computer 14 to ascertain the distance between the test point and the short circuit 28. For example, the computer 14 may identify a steep voltage drop indicative of the signal reflection 32 reaching the via 24 and determine how much time that has elapsed at the instant the sharp voltage drop begins. The distances between other test points and the short circuit may be similarly determined, and used to locate the short circuit 28.

Figure 2:
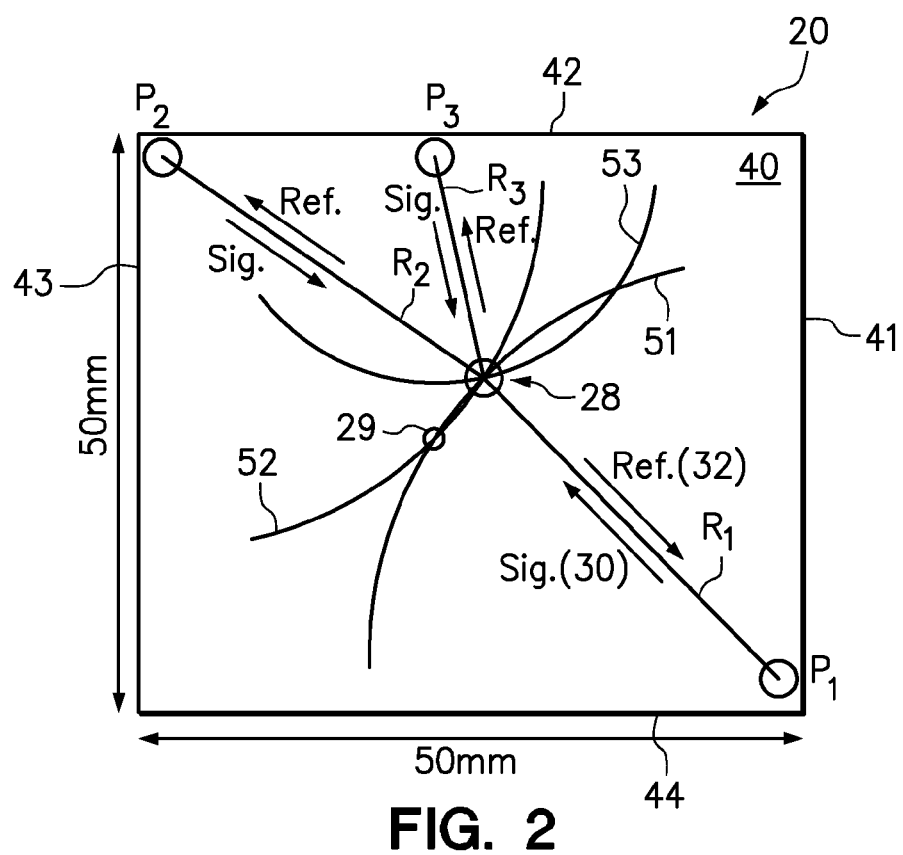
FIG. 2 is a plan view of the PCB of FIG. 1 illustrating a method of locating the short circuit by injecting test signals at three different test points.

FIG. 2 is a plan view of the PCB 20 illustrating a method of locating the short circuit 28 by injecting a test signal at each of three different test points P1, P2, P3 within a test region 40 that includes the short circuit 28, and analyzing the voltage response of the test signals. The selected test region 40 of the PCB 20 in FIG. 2 may either represent the entire PCB 20 or just a portion of the PCB 20. For example, if the PCB 20 under test has a relatively small surface area, such as the interposer of a chip package, the entire area of the PCB 20 may be selected as the test region 40. In a larger PCB, such as the motherboard of a server, the test region 40 may be a sub-region of the PCB known to contain the short circuit. Selecting the smallest possible test region 40 known to include the short circuit may desirably improve the ease of locating the short by reducing the maximum distance between the short circuit and the selected test points. For example, using a small test region may allow the point of the short circuit to be identified with measurements at only two test points. In some cases, information about the malfunctioning of the PCB 20 may provide a clue as to a particular region where the short circuit 28 is likely to be located, in which case the test region 40 may be narrowed to that particular region, and need not include the entire PCB 20. By way of example, the test region 40 illustrated in FIG. 2 is a 50 mm by 50 mm square region, which may be the entire area of a 50 mm by 50 mm PCB or just a 50 mm by 50 mm sub-region of a PCB that is larger than 50 mm by 50 mm.

A test signal is separately injected at each of three selected test points P1, P2, P3 within the boundaries of the selected test region 40. A minimum of three test points are selected in this example to avoid the possibility of indeterminate results in locating the short circuit 28, although as few as two test points may be sufficient to determine the location of the short circuit 28 under certain circumstances, as discussed below. The test points P1, P2, P3 are selected to be non-collinear, which may also help avoid indeterminate results, although this may also not be required under certain circumstances. The size and shape of a test region may depend on the circumstances, and is not limited to having a rectangular shape. For ease of illustration, the test region 40 in this example is a rectangular area having four edges 41, 42, 43, 44. Test point P1 is optionally selected near the intersection of adjacent edges 41, 44 of the test region 40. Test points P2 and P3 are each selected near the edge 42. This particular selection of the test points P1-P3 is provided merely as an example; any three non-collinear test points within the test region 40 may be used to locate the short circuit 28.

A first test signal is injected at the first test point P1. The test signal (30) and signal reflection (32) are labeled for reference. The voltage response of the test signal is analyzed (as discussed further below) to determine a first distance R1 between the test point P1 and the short circuit 28. R1 defines the radius of a circle or arc 51 along which the short circuit 28 lies, with test point P1 at the center of this arc 51. Similarly, a second test signal is injected at the second test point P2, and the voltage response is analyzed to determine a second distance R2 between the test point P2 and the short circuit 28. R2 defines the radius of a circle or arc 52 along which the short circuit 28 lies, with the second test point P2 at the center of this arc 52. Arcs 51 and 52 intersect at two different points of intersection including the location of the short circuit 28 sought and another location 29. Thus, knowledge of R1 and R2 narrow the location of the short circuit 28 to two possible points (28 and 29). However, because both points lie on the PCB 20, the location of the short circuit 28 is indeterminate when only R1 and R2 are known in this particular example. A third test signal is injected at the third test point P3, and the voltage response is analyzed to determine a third distance R3 between the test point P3 and the short circuit 28. R3 defines the radius of a circle or arc 53 along which the short circuit 28 lies, with the third test point P3 at the center of this arc 53. The three arcs 51, 52, 53 intersect at a unique point, which coincides with the location of the short circuit 28. Thus, the distances R1, R2, R3 of each of three non-collinear test points P1, P2, P3 from the short circuit 28 may be used to pinpoint the location of the short circuit 28.

In FIG. 2, the location of the short circuit 28 has been determined precisely, so as to "pinpoint" the location of the short circuit 28. However, due to the inherent uncertainty in scientific measurements, the distances R1, R2, R3 obtained using this method may include a percentage of uncertainty. The result of this analysis, therefore, may be to identify a smaller sub-region of the test region 40 within which the short circuit 28 is likely to be, without necessarily pinpointing the precise location of the short circuit 28. Even without pinpointing the location of the short circuit 28, identifying a smaller sub-region of the test region 40 wherein the short circuit 28 is likely to be, may greatly speed up the process of locating the short. A technician testing the PCB 20 may then examine the PCB 20 within the small area of the sub region, without having to examine the entire test region 40, to locate the short circuit 28. The process may be able to identify the location of the short circuit with an accuracy of about 100 mils (0.1 inch).

Thus, having determined the distances R1, R2, R3 as indicated in FIG. 2, the location of the short circuit 28 may be identified as a unique point (or at least a sub-region of the test area 40) that is the distance R1 from the test point P1, the distance R2 from the test point P2, and the distance R3 from the test point P3. This unique point may be determined manually, or using a computer, such as the computer 14 of FIG. 1. For example, the location of the short circuit 28 may be manually determined by drawing the three arcs 51, 52, 53 centered about the respective test points P1, P2, P3, and determining the intersection of the three arcs 51, 52, 53. Alternatively, the short circuit 28 may be computed, such as using the computer 14 of FIG. 1, with the three test points P1, P2, P3 and the distances R1, R2, R3 as inputs to a formula or mathematical algorithm. Mathematical approaches generally known in the art apart from application to the present invention, such as vector algebra, geometric or trigonometric relationships, or combinations thereof, may be employed. The computed location of the short circuit 28 may then be output and displayed on the display 16 of FIG. 1, such as in the form of rectangular or polar coordinates, or by graphically displaying a representation of the PCB under test and the relative location of the short circuit 28.

Figure 3:
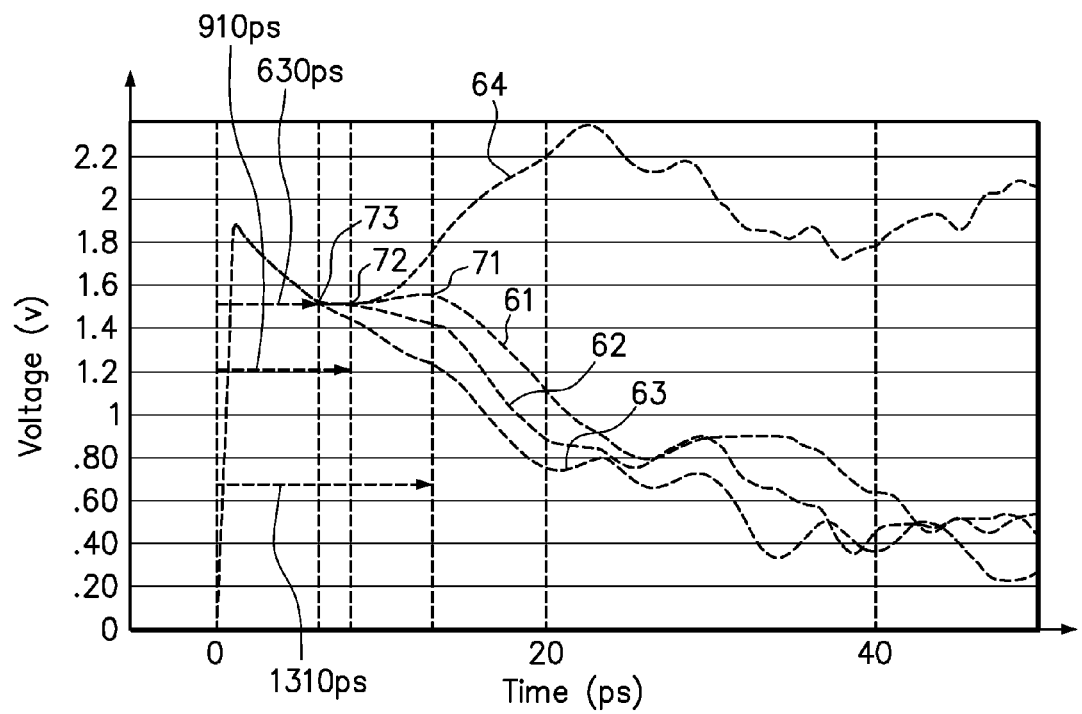
FIG. 3 is a graph of voltage versus time for each of three different test signals.

FIG. 3 is a graph of voltage versus time for each of three different test signals from which the distances R1, R2, R3 may be graphically determined. The graph includes a first curve 61 representing the voltage versus time of the first test signal, a second curve 62 representing the voltage versus time of the second test signal, and a third curve 63 representing the voltage versus time of the third test signal. Each curve represents the voltage response of the respective test signal when the short circuit 28 of FIG. 2 is present in the PCB under test. A fourth curve 64, by comparison, represents the expected voltage response of a test signal in the absence of a short circuit. Each curve 61-63 has a generally downward trend over the indicated timeframe. The reflection of each test signal is evidenced by a particularly sharp downward drop in the voltage. Specifically, a voltage drop 71 in the first curve 61 indicates a signal reflection has reached the location of origin (the test point P1 of FIG. 2) at 1310 ps. The known propagation rate of signals in the conductive material of layer P is one inch per 220 ps. Thus, the distance between the test point P1 and the short circuit 28 is ½*1310 ps*1 inch/220 ps=3.0 inches. A voltage drop 72 in the second curve 62 occurs at 910 ps, which, applying a similar analysis, indicates a distance of 2.1 inches between the second test point P2 and the short circuit 28. A voltage drop 73 in the third curve 63 occurs at 630 ps, which, again applying a similar analysis, indicates a distance of 1.4 inches between the third test point P3 and the short circuit 28.

Figure 4:
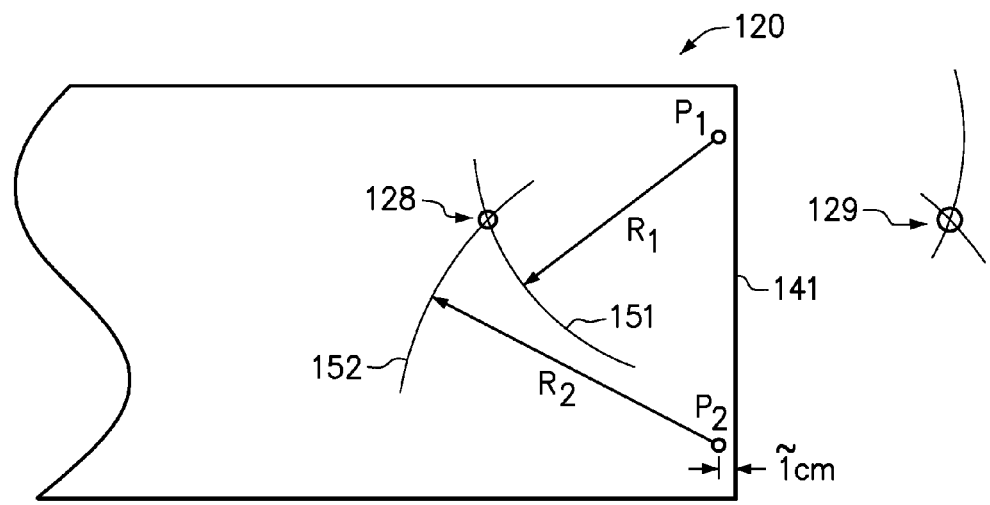
FIG. 4 is a plan view of another printed circuit board illustrating a method of locating a short circuit by injecting a test signal at only two different test points.

FIG. 4 is a plan view of another PCB 120 illustrating a method of locating a short circuit 128 by injecting a test signal at each of only two different test points P1 and P2. The two points P1, P2 are intentionally selected near to an edge 141 of the PCB 120. For example, P2 and P2 are preferably within 1 cm of the edge 141. A first test signal is injected at the first test point P1, and the voltage response is analyzed (as discussed above) to determine a first distance R1 between the test point P1 and the short circuit 128. R1 defines the radius of a circle or arc 151 along which the short circuit 128 lies, with test point P1 at the center of this arc 151. A second test signal is injected at the second test point P2, and the voltage response is analyzed to determine a second distance R2 between the test point P2 and the short circuit 128. R2 defines the radius of a circle or arc 152 along which the short circuit 128 lies, with the second test point P2 at the center of this arc 152. Arcs 151 and 152 intersect at two different points of intersection including the location of the short circuit 128 sought and another location 129. However, in this example, because test points P1 and P2 were selected very near the edge 141 of the PCB 120, only one point (coincident with the location of the short circuit 28) lies on the PCB 20. The other point 129 is outside the PCB 120, and may therefore be eliminated. Thus, using only two points P1 and P2, the location of the short circuit 128 can be determined by selecting the two test points P1 and P2 along the edge 141 of the PCB 120.

Figure 5:
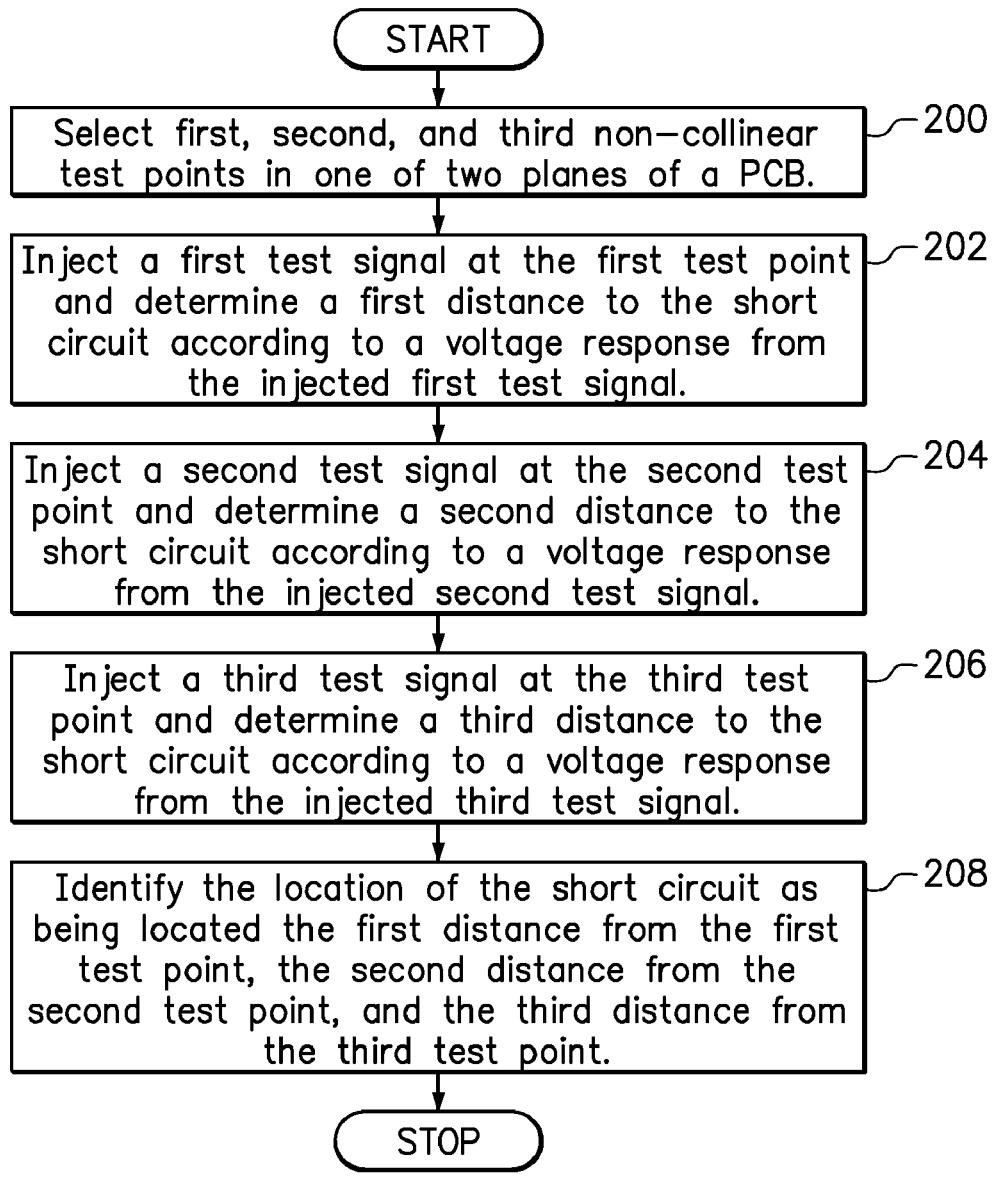
FIG. 5 is a flowchart generally outlining a method of locating a short circuit according to an embodiment of the invention.

FIG. 5 is a flowchart generally outlining a method of locating a short circuit according to an embodiment of the invention. In step 200, first, second, and third non-collinear test points in one of two layers of a PCB are selected. The two layers may be a ground layer and a power layer, for example. In step 202, a first test signal is injected at the first test point. A first distance to the short circuit is determined according to a voltage response from the injected first test signal. In step 204, a second test signal is injected at the second test point. A second distance to the short circuit is determined according to a voltage response from the injected second test signal. In step 206, a third test signal is injected at the third test point. A third distance to the short circuit is determined according to the voltage response from the injected third test signal. In step 208, the location of the short circuit is identified as being the first distance from the first test point, the second distance from the second test point, and the third distance from the third test point. The location of the short circuit may be narrowed to a small sub-region of a test area, or the location of the short circuit may even be pinpointed, depending on the level of precision by which the first, second, and third distances were determined.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, components and/or groups, but do not preclude the presence or addition of one or more other features, integers, steps, operations, elements, components, and/or groups thereof. The terms "preferably," "preferred," "prefer," "optionally," "may," and similar terms are used to indicate that an item, condition or step being referred to is an optional (not required) feature of the invention.

The corresponding structures, materials, acts, and equivalents of all means or steps plus function elements in the claims below are intended to include any structure, material, or act for performing the function in combination with other claimed elements as specifically claimed. The description of the present invention has been presented for purposes of illustration and description, but it is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A method of locating a short circuit between two layers of a printed circuit board, the method comprising:
    selecting first, second, and third non-collinear test points in one of the two layers;
    injecting a first test signal at the first test point and determining a first distance to the short circuit according to a signal reflection from the injected first test signal;
    injecting a second test signal at the second test point and determining a second distance to the short circuit according to a signal reflection from the injected second test signal;
    injecting a third test signal at the third test point and determining a third distance to the short circuit according to the signal reflection from the injected third test signal; and
    identifying the location of the short circuit as being the first distance from the first test point, the second distance from the second test point, and the third distance from the third test point.

2. The method of claim 1, further comprising:
    determining the first distance according to a first time interval required for a signal reflection from the first test signal to reach the first test point;
    determining the second distance according to a second time interval required for a signal reflection from the second test signal to reach the second test point; and
    determining the third distance according to a third time interval required for a signal reflection from the third test signal to reach the third test point.

3. The method of claim 2, further comprising:
    determining the first distance as one half of the first time interval multiplied by the propagation rate of the first test signal through the selected layer;
    determining the second distance as one half of the second time interval multiplied by the propagation rate of the second test signal through the selected layer; and
    determining the third distance as one half of the third time interval multiplied by the propagation rate of the third test signal through the selected layer.

4. The method of claim 2, further comprising:
    identifying a voltage drop in each test signal as the respective signal reflection; and
    determining the first, second, and third time intervals according to the timing of the voltage drops.

5. The method of claim 1, wherein the first layer is one of a ground layer and a power layer and the second layer is the other of a ground layer and a power layer.

6. The method of claim 1, further comprising:
    generating each of the first, second, and third test signals as a step voltage signal.

7. The method of claim 1, further comprising:
    selecting the test points at locations aligned with vias of the printed circuit board; and
    injecting each test signal at the contact pad connected to the respective via.

8. A method of locating a short circuit between two layers of a printed circuit board, the method comprising:
    selecting first and second test points in one of the two layers within 1 cm of an edge of the printed circuit board;
    injecting a first test signal at the first test point and determining a first distance to the short circuit according to a signal reflection from the injected first test signal;
    injecting a second test signal at the second test point and obtaining a second distance to the short circuit according to a signal reflection from the injected second test signal; and
    identifying the location of the short circuit as a unique point located the first distance from the first test point, the second distance from the second test point, and within the printed circuit board.

9. The method of claim 8, further comprising identifying two locations located the first distance from the first test point and the second distance from the second test point and eliminating one of the identified locations that does not lie on the printed circuit board.

10. The method of claim 8, further comprising:
    determining the first distance according to a first time interval required for a signal reflection from the first test signal to reach the first test point; and
    determining the second distance according to a second time interval required for a signal reflection from the second test signal to reach the second test point.

11. The method of claim 10, further comprising:
    determining the first distance as the first time interval multiplied by the propagation rate of the first test signal through the selected layer; and
    determining the second distance as the second time interval multiplied by the propagation rate of the second test signal through the selected layer.

12. The method of claim 10, further comprising:
    identifying a voltage drop in each test signal as the respective signal reflection; and
    determining the first, second, and third time intervals according to the timing of the voltage drops.

13. The method of claim 9, wherein the first layer is one of a ground layer and a power layer and the second layer is the other of a ground layer and a power layer.

14. The method of claim 9, further comprising:
    generating each of the first, second, and third test signals as a step voltage signal.

15. The method of claim 9, further comprising:
    selecting the test points at locations aligned with vias of the printed circuit board; and
    injecting each test signal at the contact pad connected to the respective via.

16. A computer program product including computer usable program code embodied on a non-transitory computer usable storage medium for locating a short circuit in a printed circuit board, the computer program product including:
    computer usable program code for injecting a first test signal at a first test point and determining a first distance to the short circuit according to a signal reflection from the injected first test signal;

computer usable program code for injecting a second test signal at a second test point and obtaining a second distance to the short circuit according to a signal reflection from the injected second test signal;

computer usable program code for injecting a third test signal at a third test point and obtaining a third distance to the short circuit according to the signal reflection from the injected third test signal; and computer usable program code for identifying the location of the short circuit as being the first distance from the first test point, the second distance from the second test point, and the third distance from the third test point.

* * * * *